US008999205B2

(12) United States Patent
Oh et al.

(10) Patent No.: US 8,999,205 B2
(45) Date of Patent: Apr. 7, 2015

(54) METAL NANOWIRES WITH HIGH LINEARITY, METHOD FOR PRODUCING THE METAL NANOWIRES AND TRANSPARENT CONDUCTIVE FILM INCLUDING THE METAL NANOWIRES

(75) Inventors: Young-Jei Oh, Seoul (KR); Byung-yong Wang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 30 days.

(21) Appl. No.: 13/403,140

(22) Filed: Feb. 23, 2012

(65) Prior Publication Data

US 2013/0087363 A1    Apr. 11, 2013

(30) Foreign Application Priority Data

Oct. 11, 2011    (KR) .................. 10-2011-0103436

(51) Int. Cl.
| | |
|---|---|
| *H01B 1/02* | (2006.01) |
| *B22F 1/00* | (2006.01) |
| *B82Y 30/00* | (2011.01) |
| *C22C 5/06* | (2006.01) |
| *C22C 9/00* | (2006.01) |
| *C22C 19/03* | (2006.01) |
| *B22F 9/24* | (2006.01) |
| *H01L 31/0224* | (2006.01) |
| *H01L 31/18* | (2006.01) |
| *B22F 3/10* | (2006.01) |

(52) U.S. Cl.
CPC ............... *B22F 1/0025* (2013.01); *B82Y 30/00* (2013.01); *C22C 5/06* (2013.01); *C22C 9/00* (2013.01); *C22C 19/03* (2013.01); *H01B 1/02* (2013.01); *H01B 1/026* (2013.01); *B22F 9/24* (2013.01); *H01L 31/022466* (2013.01); *H01L 31/1884* (2013.01); *B22F 3/10* (2013.01); *Y02E 10/50* (2013.01)

(58) Field of Classification Search
CPC ........ B82Y 30/00; B82Y 20/00; B82Y 10/00; G01N 21/658; G01N 27/127
USPC .......................................... 252/512, 513, 514
See application file for complete search history.

(56) References Cited

U.S. PATENT DOCUMENTS

| | | | |
|---|---|---|---|
| 2005/0074589 A1* | 4/2005 | Pan et al. ....................... | 428/206 |
| 2008/0210052 A1 | 9/2008 | Allemand | |
| 2008/0286447 A1 | 11/2008 | Alden et al. | |
| 2011/0185852 A1* | 8/2011 | Allemand ....................... | 75/343 |
| 2011/0185853 A1* | 8/2011 | Wang et al. ..................... | 75/371 |
| 2012/0094192 A1* | 4/2012 | Qu et al. ........................ | 429/336 |
| 2012/0132930 A1* | 5/2012 | Young et al. .................... | 257/84 |
| 2013/0230717 A1* | 9/2013 | Xia et al. ....................... | 428/397 |

* cited by examiner

Primary Examiner — Mark Kopec
Assistant Examiner — William Young
(74) Attorney, Agent, or Firm — Ladas & Parry LLP

(57) ABSTRACT

Metal nanowires with high linearity can be produced using metal salts at a relatively low temperature. A transparent conductive film can be formed using the metal nanowires. Particularly, the transparent conductive film has high transmittance, low sheet resistance, and good thermal, chemical and mechanical stability. The transparent conductive film has a high electrical conductivity due to the high linearity of the metal nanowires. The metal nanowires take up 5% or less of the volume of the transparent conductive film, ensuring high transmittance of the transparent conductive film. Furthermore, the metal nanowires are useful as replacements for existing conductive materials, such as ITO, conductive polymers, carbon nanotubes and graphene. The metal nanowires can be applied to flexible substrates and other various substrates due to their good adhesion and high applicability to the substrates. Moreover, the metal nanowires can find application in various fields, such as displays and solar cell devices.

4 Claims, 5 Drawing Sheets

(2a)    (2b)

(3a)

(3b)

6(a)

(6b)

(6c)

METAL NANOWIRES WITH HIGH LINEARITY, METHOD FOR PRODUCING THE METAL NANOWIRES AND TRANSPARENT CONDUCTIVE FILM INCLUDING THE METAL NANOWIRES

CROSS-REFERENCE TO RELATED APPLICATIONS

This application claims priority under 35 U.S.C. §119 to Korean Patent Application No. 10-2011-0.103436 filed on Oct. 11, 2011, in the Korean Intellectual Property Office, the disclosure of which is incorporated herein by reference in its entirety.

BACKGROUND OF THE INVENTION

1. Field of the Invention

The present invention relates to metal nanowires with high linearity and a transparent conductive film including the same. More specifically, the present invention relates to metal nanowires with high linearity that have excellent electrical properties and high transmittance; and a transparent conductive film that includes the metal nanowires and is thus suitable for use as a transparent electrode for a variety of electronic devices, including flexible electronics, and energy devices.

2. Description of the Related Art

Transparent conducting materials (TCMs) should exhibit a high transmittance ($\geq 90\%$) in the visible wavelength range of 380 to 780 nm and a low resistivity ($\sim 2 \times 10^{-4}$ $\Omega/cm$). These characteristics enable the wide use of transparent conducting materials in transparent electrodes for displays, digital TVs, next-generation mobile communication devices, solar cells, touch panels, OLEDs, and the like.

Metal oxides, such as indium tin oxide (ITO), aluminum-doped zinc oxide (AZO) and fluorine-doped tin oxide (FTO), are typically used as representative transparent conducting materials. Thin films of metals, such as Au, Ag, Cu and Ni, are currently under study as transparent conducting materials.

ITO, which is presently the most widely used type of transparent conducting material, has high electrical conductivity, good chemical stability and excellent electrical and optical properties, such as high transmittance. However, since indium as a principal material of ITO is an expensive limited resource, a new transparent conducting material as a substitute for ITO is strongly needed.

Particularly, most ITO thin films are formed by physical vapor deposition (PVD) techniques, such as sputtering and E-beam evaporation, which require high temperatures of 400° C. or more or heat treatment. This heating leads to high production costs of ITO thin films and makes it difficult to form ITO thin films on highly flexible plastic substrates and films. Further, ITO films deposited on polymer films are not satisfactory in terms of flexibility and are readily degraded when exposed to plasma, resulting in deterioration of their characteristics.

Research is being undertaken on the use of conductive polymers as organic materials for transparent electrodes. However, the electrical conductivity of conductive polymers generally increases in proportion to the thickness of electrodes. Conductive polymers absorbing light in the visible region should be coated as thinly as possible to achieve high transmittance sufficient for use in displays. However, a sheet resistance of 1 k$\Omega$/sq. or less is generally not obtained in a 50 nm thick coating of a conductive polymer on a substrate. A thicker coating of the conductive polymer is required to obtain a lower sheet resistance. That is, a conductive polymer having a high transmittance in the visible region does not meet electrical properties required in application fields of transparent electrodes.

In an effort to solve such problems, the present inventor has tried to develop a technique for producing nano-scale wires of metals, such as Au, Ag, Cu and Ni, that have improved conductivity while minimizing the scattering of light in the visible region.

As the prior art, U.S. Patent Publication No. 2008/0210052 A1 discloses a method for producing nanowires of metals, such as Ag, Au and Pt, having a diameter of 75±8 nm and a length of 9.7±2.6 µm from a reaction mixture including a metal salt, a capping agent and an ammonium compound in a reducing solvent. Further, U.S. Patent Publication No. 2008/0286447 A1 discloses a method for forming a transparent conductive film using metal nanowires.

Hydrothermal synthesis, chemical vapor synthesis and polyol methods have been widely investigated to date as methods for synthesizing metal nanowires. Chemical vapor synthesis necessitates the use of expensive equipment for mass production and requires an additional process for the removal of by-products after synthesis. In contrast, chemical vapor synthesis and polyol methods are simple to carry out and enable mass production of metal nanowires at reduced costs. Despite these advantages, hydrothermal synthesis has a problem in that aggregation of particles in aqueous solutions tends to increase. Other problems of hydrothermal synthesis are that particles are not uniform in size even after drying and are not readily dispersible, making it difficult to prepare coating solutions.

SUMMARY OF THE INVENTION

Accordingly, it is a first object of the present invention to provide a method for producing metal nanowires in which a polyol method is used to facilitate the formation and growth of seeds and the control of the diameter of particles, achieving high linearity (high aspect ratio) of metal nanowires and high dispersibility of metal nanowires in a coating solution.

It is a second object of the present invention to provide a method for forming a transparent conductive film with improved characteristics, such as high transmittance and high sheet resistance, from a coating solution containing the metal nanowires dispersed therein at a low temperature and low cost.

In order to achieve the first object of the present invention, there is provided a method for producing metal nanowires with high linearity, the method including:

(a) mixing a polymeric material and a reducing agent in a solvent and stirring the mixture to prepare a first mixed solution;

(b) adding a first metal salt to the first mixed solution to prepare a second mixed solution containing metal seeds formed therein; and (c) adding a second metal salt to the second mixed solution and allowing to react to form metal nanowires, wherein the solvent is a mixture of distilled water and at least one solvent selected from diethanolamine, triethanolamine, ethylene glycol and diethylene glycol, the polymeric material is selected from polymethyl methacrylate, polyvinylpyrrolidone, polyvinyl butyral, polyethyl methacrylate and mixtures thereof, each of the polymers having a molecular weight of 800,000 to 2,000,000, the reducing agent is selected from hydrazine, sodium borohydride, sodium chloride, sodium hydroxide, sodium phosphinate monohydrate, ammonium hydroxide, potassium bromide, cetyltrimethylammonium bromide and mixtures thereof, and the metal is selected from Ag, Cu and Ni; the first metal salt and the second metal salt are each independently an acetate, nitrate, chloride or sulfate salt including a metal selected from Ag, Cu and Ni; and the first metal salt and the second metal salt are salts of the same metal.

In an embodiment of the present invention, the method may further include (d) coating the surface of the metal nanowires with a metal selected from Au, Pt, Ti, Ni, Al, W and Co.

In an embodiment of the present invention, the first metal salt and the second metal salt may be each independently a metal salt including Cu and the reaction may be carried out by heating to 80 to 130° C. to form Cu nanowires in step (c).

In an alternative embodiment of the present invention, the first metal salt and the second metal salt may be each independently a metal salt including Ag and the reaction may be carried out by heating to 150 to 180° C. to form Ag nanowires in step (c).

In an alternative embodiment of the present invention, the first metal salt and the second metal salt may be each independently a metal salt including Ni and the reaction may be carried out by heating to 140 to 180° C. to form Ni nanowires in step (c).

According to the present invention, there are provided Ag, Cu or Ni nanowires produced by the method wherein the metal nanowires have a diameter of 20 to 50 nm and a length of 30 to 50 μm.

In order to achieve the second object of the present invention, there is provided a method for forming a transparent conductive film, the method including:

(e) dispersing the metal nanowires in a solvent to prepare a coating solution; and (f) coating the coating solution on a substrate, wherein the solvent is selected from distilled water, ethyl alcohol, methyl alcohol, acetone, isopropyl alcohol, butyl alcohol, ethylene glycol, diethylene glycol, toluene, N-methyl-2-pyrrolidone and mixtures thereof, and the substrate is selected from glass, silicon and plastic substrates.

In an embodiment of the present invention, the metal nanowires may be used in an amount of 3 to 8% by weight, based on the total weight of the coating solution.

In an embodiment of the present invention, the metal nanowires may be dispersed by sonication at 300 to 500 W in step (e).

In an embodiment of the present invention, the method may further include (g) post-treating the coated solution using a thermal sintering system or an intense pulsed light sintering system to improve the electrical and optical properties of the transparent conductive film.

In an embodiment of the present invention, the coating may be performed by a coating technique selected from dip coating, spray coating, roll-to-roll coating, gravure coating, spin coating and bar coating in step (f).

According to the present invention, there is provided a transparent conductive film formed by the method wherein the transparent conductive film has a transmittance of 91 to 98% in the visible region and a sheet resistance of 8 to 20 Ω/sq. According to the present invention, there is provided an electrode for a display device or an energy device wherein the electrode includes the transparent conductive film.

According to the present invention, the metal nanowires have high linearity and can be produced using metal salts at a relatively low temperature. Particularly, according to the present invention, the metal nanowires can be used to form a transparent conductive film with high transmittance, low sheet resistance, and good thermal, chemical and mechanical stability. The transparent conductive film of the present invention has a high electrical conductivity due to the high linearity of the metal nanowires. In addition, the metal nanowires take up 5% or less of the volume of the transparent conductive film, ensuring high transmittance of the transparent conductive film. Furthermore, the metal nanowires of the present invention are useful as replacements for existing conductive materials, such as ITO, conductive polymers, carbon nanotubes and graphene. The metal nanowires of the present invention can be applied to flexible substrates and other various substrates due to their good adhesion and high applicability to the substrates. Moreover, the metal nanowires of the present invention can find application in various fields, such as displays and solar cell devices.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
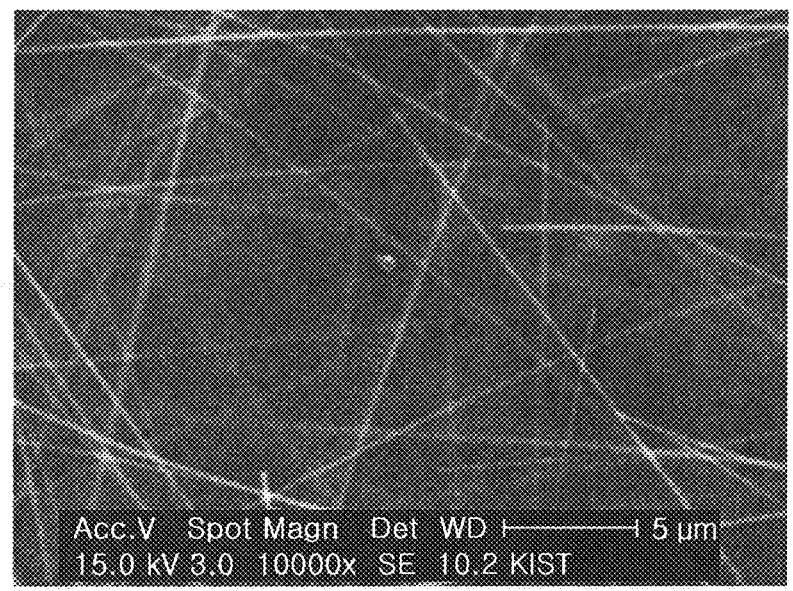
FIG. 1 is a scanning electron microscopy (SEM) image of Ag nanowires produced in Example 1.

The present invention will now be described in greater detail.

Generally, transparent conductive films should meet basic industrial requirements of large area and mass production. Such transparent conducting materials are widely applicable to electrodes for various energy devices, such as solar cells and secondary batteries, as well as electrodes for display devices, such as LCDs, OLEDs and touch screen panels. Limited indium resources and typical physical deposition techniques for film formation, such as sputtering and E-beam evaporation, are responsible for high formation costs of indium films. Particularly, ITO films are apt to crack during bending, resulting in an increase in resistance.

The present invention has been made in view of the above problems and provides a method for forming a transparent conductive film on a large area in an easy manner by a continuous process, thus being very advantageous in terms of price competitiveness. A transparent conductive film formed by the method has excellent stability against external impacts and variations. Particularly, the present invention provides a transparent conductive film with a transmittance of 90% or more and a sheet resistance of 30 Ω/sq. or less.

The present invention also provides a method for producing metal nanowires in which a polyol method is used for the formation and growth of seeds to facilitate the control of the diameter of particles. According to the method of the present invention, metal nanowires with high linearity (high aspect ratio) and size uniformity of nanowire can be produced. Specifically, the metal nanowires have a diameter of 20 to 50 nm and a length of 30 to 50 μm.

The method of the present invention includes:

(a) mixing a polymeric material and a reducing agent in a solvent and stirring the mixture to prepare a first mixed solution;

(b) adding a first metal salt to the first mixed solution to prepare a second mixed solution containing metal seeds formed therein; and (c) adding a second metal salt to the second mixed solution and allowing to react to form metal nanowires.

The solvent is used to dissolve the metal salts, such as Ag, Cu and Ni salts. The solvent is preferably a mixture of distilled water and at least one solvent selected from ethanolamine compounds, such as diethanolamine (DEA) and triethanolamine (TEA), ethylene glycol (EG) and diethylene glycol (DEG).

The first metal salt and the second metal salt may be added to the first mixed solution and the second mixed solution, respectively. Alternatively, two separately prepared solutions of the first metal salt and the second metal salt in the solvent may be added through a separatory funnel for a certain time or sprayed using a spray gun.

Each of the metal salts is preferably acetate, nitrate, chloride or sulfate salt of Ag, Cu and Ni, or a combination thereof.

In the method of the present invention, the use of different salts of the same metal as the first and second metal salts was confirmed to show improved effects in terms of high linearity and dispersibility. It could also be confirmed from the following examples section that when the salt added for the formation of seeds was different from the salt added for the growth of the seeds in the subsequent step, the physical properties of the final nanowires, such as high linearity and dispersibility, were markedly improved.

The reducing agent is used for ion formation. The reducing agent is preferably hydrazine ($N_2H_4H_2O$), sodium borohydride ($H_4BNa$), sodium chloride (NaCl), sodium hydroxide (NaOH), sodium phosphinate monohydrate (SPM), ammonium chloride ($NH_4Cl$), potassium bromide (KBr), cetyltrimethylammonium bromide (CTBA) or a combination thereof.

The polymeric material is not particularly limited so long as it can be used to control the size and aggregation of particles. The polymeric material is preferably polymethyl methacrylate (PMMA), polyvinylpyrrolidone (PVP), polyvinyl butyral (PVB), polyethyl methacrylate (PEMA) or a combination thereof.

The method of the present invention may further include (d) coating the surface of the metal nanowires with a metal selected from Au, Pt, Ti, Ni, Al, W and Co. When it is intended to coat a chloride of Au, Pt, Ti, Ni, Al, W or Co on the metal nanowires, a mixture of the metal chloride and a polar or non-polar solvent is used. The solvent is preferably selected from the group consisting of distilled water, acetone, methyl ethyl ketone, ethyl alcohol, butyl alcohol, ethylene glycol, diethylene glycol, toluene, octadecyl amine and combinations thereof.

The present invention also provides a method for forming a transparent conductive film, the method including:

(e) dispersing the metal nanowires in a solvent to prepare a coating solution; and (f) coating the coating solution on a substrate.

The solvent is used to dissolve and disperse the metal nanowires. The solvent is preferably selected from the group consisting of distilled water, ethyl alcohol, methyl alcohol, acetone, isopropyl alcohol, butyl alcohol, ethylene glycol, diethylene glycol, toluene, N-methyl-2-pyrrolidone, and combinations thereof.

For uniform dispersion of the metal nanowires in the solvent, sonication is performed using a sonicator at 300 to 500 W for 5 to 20 min.

The coating of the metal nanowires is preferably performed by a coating technique selected from dip coating, spray coating, roll-to-roll coating, gravure coating, spin coating and bar coating.

The substrate is not limited so long as it is highly reactive with the metal nanowires. For example, the substrate may be a glass, silicon or plastic substrate.

The transparent conductive film formed by the method of the present invention may undergo drying. After drying, the transparent conductive film may undergo at least one additional processing step to remove the binder material using heat or light, followed by heat treatment to reduce the contact resistance between the metal nanowires.

The present invention will be explained in more detail with reference to the following examples. However, these examples are provided for illustrative purposes only and are not intended to limit the scope of the invention. It will be evident to those skilled in the art that various modifications and changes are possible without departing from the scope and spirit of the invention as defined in the appended claims.

EXAMPLES

Example 1

5-8 g of polyvinylpyrrolidone (PVP K-90) having a molecular weight between 900,000 and 1,500,000 was added to 200 ml of ethylene glycol (EG) in a round-bottom flask and slowly stirred in an oil bath. After the mixture was heated to a temperature of 170° C., 0.01-0.2 g of cetyltrimethylammonium bromide (CTBA) or potassium bromide (KBr) as a reducing agent was added thereto and was allowed to react with stirring for 40 min. To the reaction solution was added 0.5-1 g of silver chloride. The reaction was allowed to proceed. After addition of 1-3 g of silver nitrate, the reaction was allowed to proceed to produce Ag nanowires with high linearity. The Ag nanowires were found to have a diameter of 30 nm or less and a length of 40 μm or more.

FIG. 1 is a scanning electron microscopy (SEM) image of the Ag nanowires.

Example 2

Figure 2:
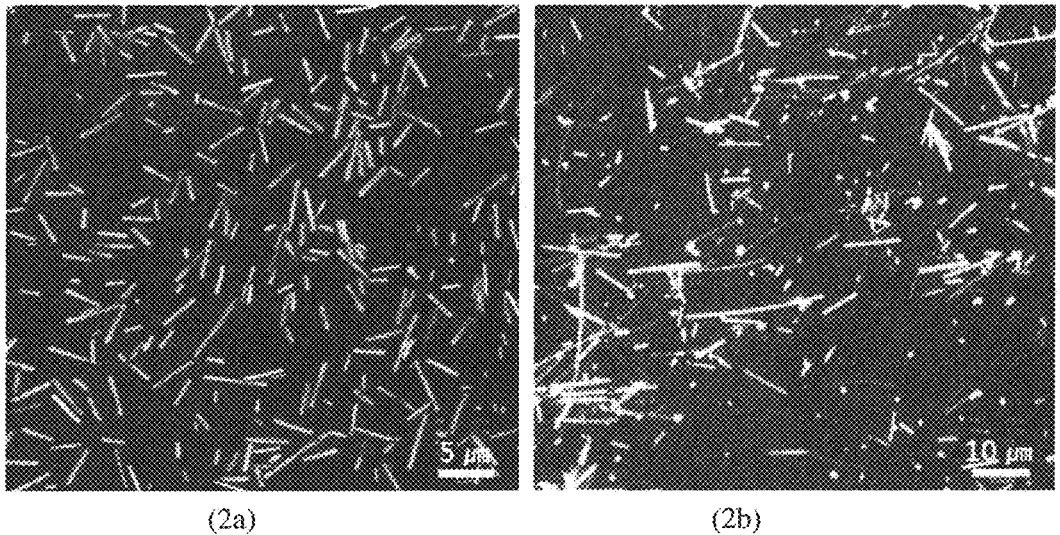
FIG. 2 shows scanning electron microscopy (SEM) images of Ag nanowires produced using PVP having a molecular weight of 800,000 (2a) and Ag nanowires produced using PVP K-120 having a molecular weight of 2,000,000 (2b) in Example 2.

Two kinds of Ag nanowires were produced in the same manner as in Example 1, except that PVP having a molecular weight between 500,000 and 800,000 and PVP K-120 having a molecular weight between 2,000,000 and 3,000,000 were separately used. FIG. 2 shows scanning electron microscopy (SEM) images of the Ag nanowires produced using the PVP (2a) and the Ag nanowires produced using the PVP K-120 (2b). The SEM images confirm that it is more difficult to increase the diameter of the Ag nanowires when the polyvinylpyrrolidone having a lower molecular weight is used.

Example 3

Ag nanowires were produced in the same manner as in Example 1, except that the cetyltrimethylammonium bromide (CTBA) or potassium bromide (KBr) was added in different amounts of 0.01-0.5 g.

Figure 3:
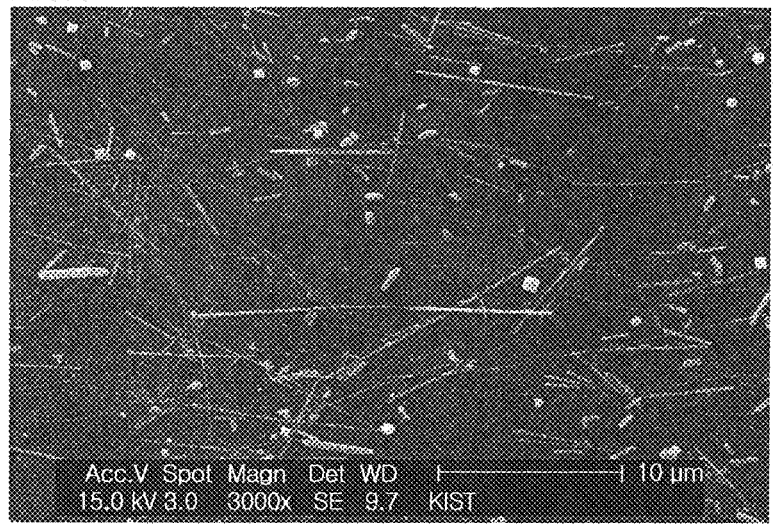
FIG. 3 shows scanning electron microscopy (SEM) images of Ag nanowires produced by the addition of 0.01 g of a reducing agent (3a) and Ag nanowires produced by the addition of 0.5 g of a reducing agent (3b) in Example 3.
Figure 3:
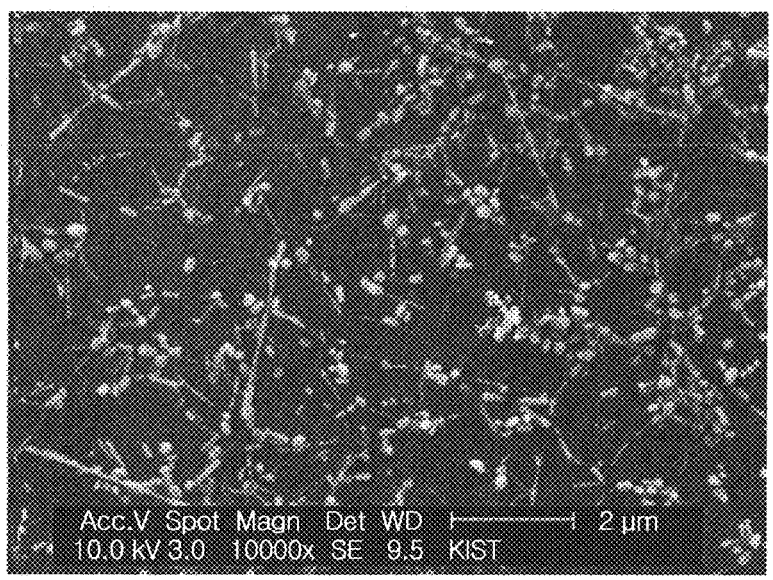

FIG. 3 shows scanning electron microscopy (SEM) images of the Ag nanowires. Spherical Ag particles are observed, together with the Ag nanowires, in the SEM image (3b).

Example 4

0.1-3.0 g of polyvinylpyrrolidone (PVP K-90) having a molecular weight between 900,000 and 1,500,000 was added to 200 ml of ethylene glycol (EG) in a round-bottom flask and slowly stirred in an oil bath. After the mixture was heated to a temperature of 120° C., sodium hydroxide (NaOH), cetyltrimethylammonium bromide (CTBA) and potassium bromide (KBr) as reducing agents were added thereto and was allowed to react with stirring for 30 min. To the reaction solution was added 0.1-0.5 g of copper chloride. The reaction was allowed to proceed for 1 hr. After addition of 0.5-2.0 g of copper nitrate, the reaction was allowed to proceed for 2 hr to produce Cu nanowires with high linearity.

Figure 4:
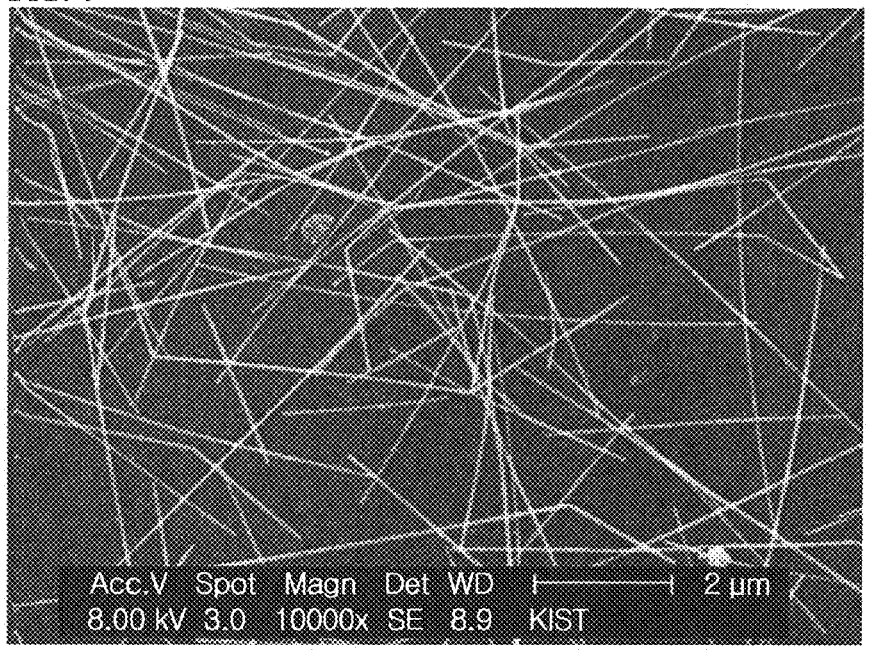
FIG. 4 is a scanning electron microscopy (SEM) image of Cu nanowires produced in Example 4.

FIG. 4 is a scanning electron microscopy (SEM) image of the Cu nanowires.

Example 5

Polyvinylpyrrolidone (PVP) having a molecular weight between 1,300,000 and 2,000,000 was added to 200 ml of ethylene glycol (EG) in a round-bottom flask and slowly stirred in an oil bath. After the mixture was heated to a temperature of 160° C., 0.5-2.0 g of sodium hydroxide (NaOH) or hydrazine ($N_2H_4H_2O$) as a reducing agent was added thereto and was allowed to react with stirring for 40 min. To the reaction solution was added 1-2 g of nickel nitrate. The reaction was allowed to proceed to produce Ni nanowires.

Figure 5:
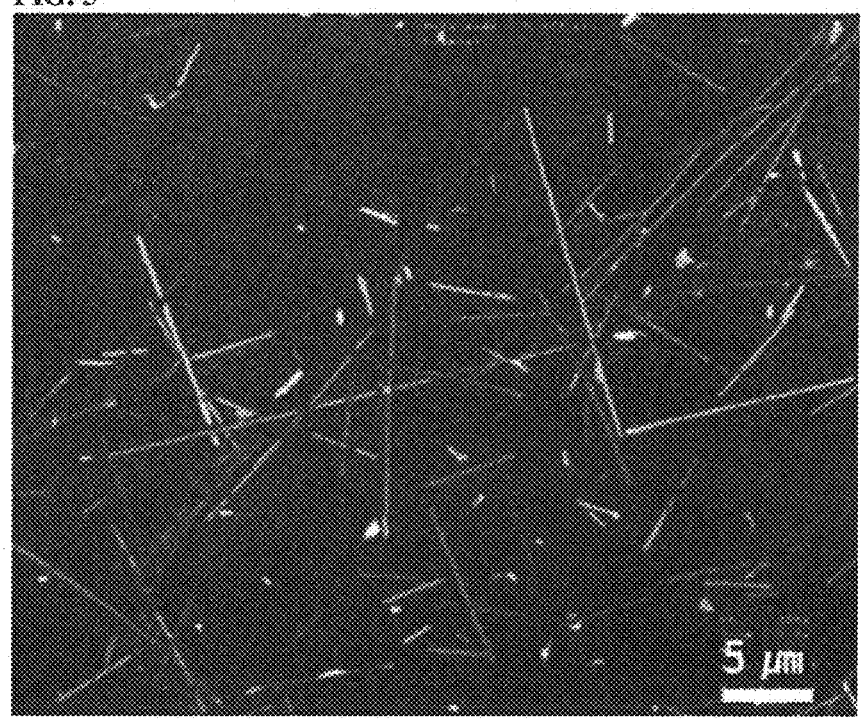
FIG. 5 is a scanning electron microscopy (SEM) image of Ni nanowires produced in Example 5.

FIG. 5 is a scanning electron microscopy (SEM) image of the Ni nanowires.

Example 6

The Ag nanowires, Cu nanowires and Ni nanowires produced in the foregoing examples were separately dispersed in ethanol to prepare coating solutions. The coating solutions were coated on PET substrates by spray coating and roll-to-roll coating to form transparent conductive films. The transmittances of the transparent conductive films were measured.

Figure 6:
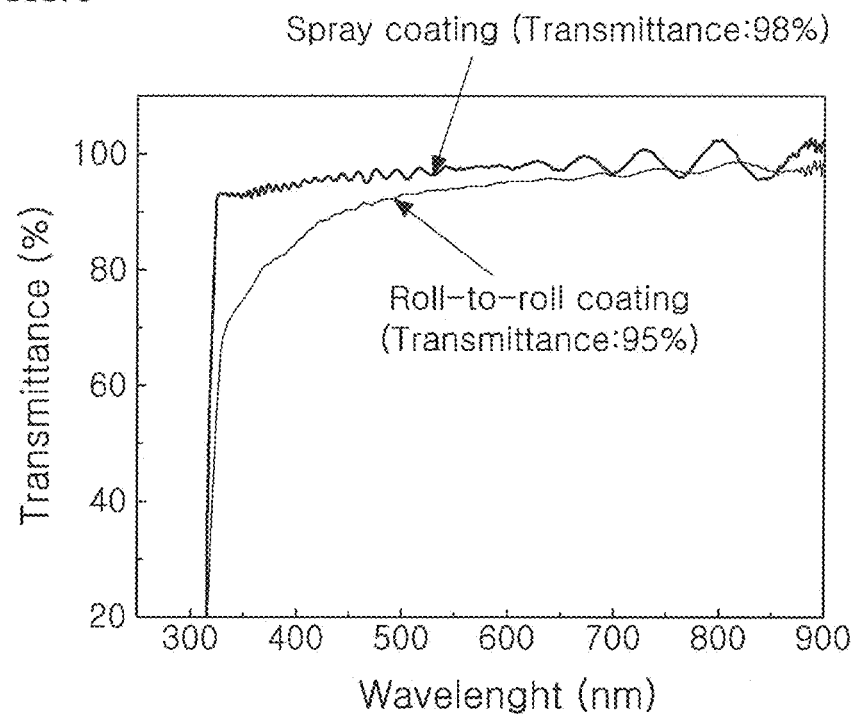
FIG. 6 graphically shows the transmittance of a transparent conductive film formed using Ag nanowires by spray coating and the transmittance of a transparent conductive film formed using Ag nanowires by roll-to-roll coating (6a), the transmittance of a transparent conductive film formed using Cu nanowires (6b), and the transmittance of a transparent conductive film formed using Ni nanowires (6c).
Figure 6:
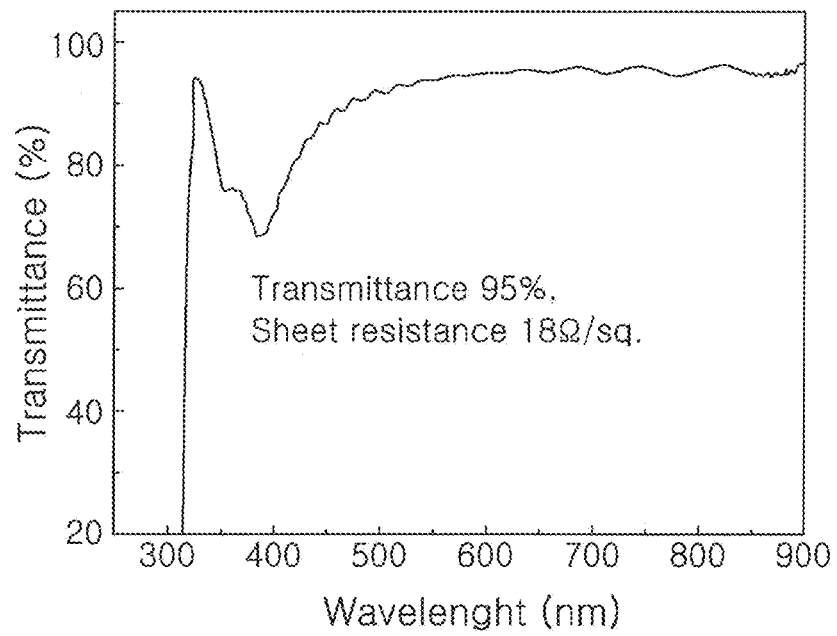
Figure 6:
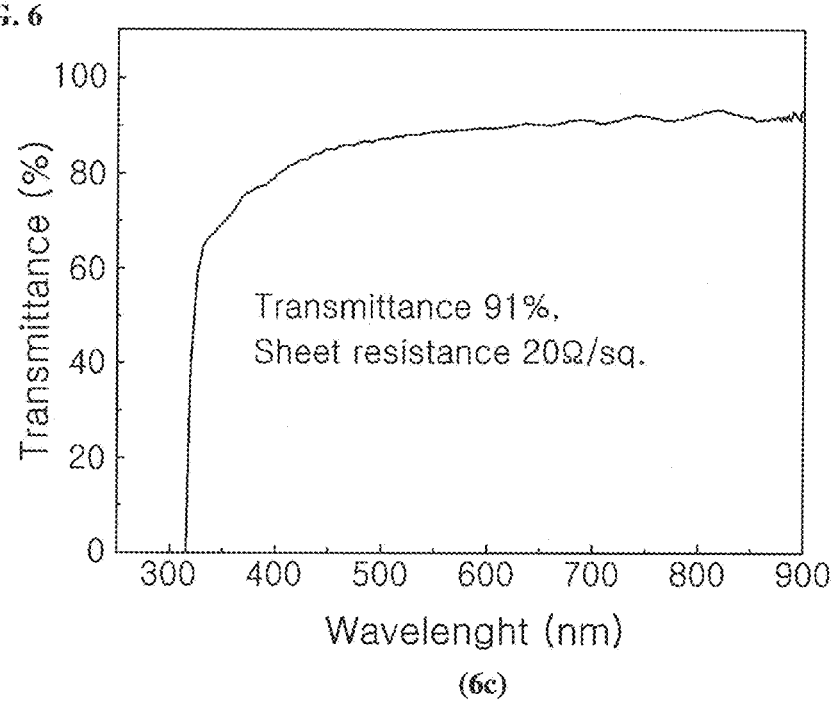

FIG. 6 graphically shows the transmittance of the transparent conductive film formed using the Ag nanowires by spray coating and the transmittance of the transparent conductive film formed using the Ag nanowires by roll-to-roll coating (6a), the transmittance of the transparent conductive film formed using the Cu nanowires (6b), and the transmittance of the transparent conductive film formed using the Ni nanowires (6c). As can be seen from FIG. 6, the transparent conductive films formed using the Ag nanowires by spray coating and roll-to-roll coating have high transmittances of 95-98% in the visible region (550 nm) and sheet resistances of 12-15 $\Omega$/sq. (6a). The transparent conductive film formed using the Cu nanowires and the transparent conductive film formed using the Ni nanowires have high transmittances of 95 and 91% and sheet resistances of 18 and 20 $\Omega$/sq., respectively (6b and 6c).

As is apparent from the foregoing, according to the present invention, metal nanowires can be uniformly coated without the addition of an extra binder. In addition, a conductive coating film including the metal nanowires can be formed on a substrate using an intense pulsed light (IPL) heating system and a thermal sintering system without damage to the substrate. The transparent conductive coating film of the present invention has good resistance to heat and moisture and solves the problem of increased resistance arising from the use of a binder, achieving markedly improved electrical conductivity.

What is claimed is:
1. A method for producing metal nanowires with high linearity, the method comprising:
   (a) mixing a polymeric material and a reducing agent in a solvent and stirring the mixture to prepare a first mixed solution;
   (b) adding a first metal salt to the first mixed solution to prepare a second mixed solution containing metal seeds formed therein; and
   (c) adding a second metal salt to the second mixed solution and reacting to form metal nanowires,
   wherein the solvent is a mixture of distilled water and at least one solvent selected from diethanolamine and triethanolamine,
   the polymeric material is selected from polymethyl methacrylate, polyvinyl butyral, polyethyl methacrylate and mixtures thereof, each of the polymers having a molecular weight of 800,000 to 2,000,000,
   the reducing agent is selected from sodium borohydride, sodium hydroxide, sodium phosphinate monohydrate, ammonium hydroxide, potassium bromide, cetyltrimethylammonium bromide and mixtures thereof, and
   the first metal salt and the second metal salt are each independently an acetate, nitrate, chloride or sulfate salt comprising a metal selected from Cu and Ni; and the first metal salt and the second metal salt are different salts of the same metal.

2. The method according to claim 1, further comprising (d) coating the surface of the metal nanowires with a metal selected from Pt, Ti, Al, and Co.

3. The method according to claim 1, wherein the first metal salt and the second metal salt are each copper salt, and heating to 80 to 130° C. to form Cu nanowires in step (c).

4. The method according to claim 1, wherein the first metal salt and the second metal salt are each a nickel salt and heating to 140 to 180° C. to form Ni nanowires in step (c).

* * * * *